(12) United States Patent
Kim et al.

(10) Patent No.: US 7,980,196 B2
(45) Date of Patent: Jul. 19, 2011

(54) APPARATUS AND METHOD FOR COATING POLYIMIDE LAYER

(75) Inventors: Bong Chul Kim, Daegu (KR); Jun Beom Cho, Gyeonggi-do (KR); Seung Hyung Lee, Gyeonggi-do (KR); Kyo Yong Koo, Gyeongsangbuk-do (KR); Hyeon Jin Seo, Gyeongsangbuk-do (KR); Dhang Kwon, Daejeon (KR); Robert Taff, Pleasanton, CA (US)

(73) Assignees: LG Display Co., Ltd., Seoul (KR); ULVAC, Inc., Kanagawa-ken (JP)

( * ) Notice: Subject to any disclaimer, the term of this patent is extended or adjusted under 35 U.S.C. 154(b) by 438 days.

(21) Appl. No.: 11/647,232

(22) Filed: Dec. 29, 2006

(65) Prior Publication Data
US 2007/0292627 A1    Dec. 20, 2007

(30) Foreign Application Priority Data
Jun. 20, 2006   (KR) .................. 10-2006-0055575

(51) Int. Cl.
*B05C 21/00*    (2006.01)
(52) U.S. Cl. ............ 118/302; 118/304; 347/22; 347/28; 347/33; 134/184; 134/186
(58) Field of Classification Search .......... 118/302, 118/304; 347/22, 28, 33; 134/184, 186; 222/148; 239/104, 106, 114, 115, 120, 121, 239/123
See application file for complete search history.

(56) References Cited

U.S. PATENT DOCUMENTS

| | | | | |
|---|---|---|---|---|
| 6,183,058 B1 * | 2/2001 | Sharma et al. | ................. | 347/28 |
| 6,676,242 B2 * | 1/2004 | Yun | ................. | 347/28 |
| 7,073,886 B2 * | 7/2006 | Nakamura | ................. | 347/33 |
| 2002/0140762 A1 * | 10/2002 | Sharma et al. | ................. | 347/28 |

FOREIGN PATENT DOCUMENTS

| | | |
|---|---|---|
| JP | 8-150710 A | 6/1996 |
| JP | 2003-136013 A | 5/2003 |
| JP | 2003-266719 A | 9/2003 |
| JP | 2003-311231 A | 11/2003 |
| JP | 2003-340340 A | 12/2003 |
| JP | 2004-247498 A | 9/2004 |
| JP | 2005-205329 A | 8/2005 |

OTHER PUBLICATIONS

Office Action issued in corresponding Japanese Application No. 2006-354347.

* cited by examiner

*Primary Examiner* — Laura Edwards
(74) *Attorney, Agent, or Firm* — Morgan, Lewis & Bockius LLP (57) ABSTRACT

An apparatus for coating a polyimide layer includes a printing table in which a substrate is provided, an inkjet head having an injection surface with nozzles for injecting a polyimide liquid onto the substrate, a polyimide liquid supply tank filled with the polyimide liquid, an ultrasonic cleaner in which a cleaning liquid for cleaning the inkjet head is stored for cleaning the inkjet head with vibrations in the cleaning liquid generated by applying an ultrasonic signal, and a wiper for wiping an injection surface of the inkjet head.

7 Claims, 7 Drawing Sheets

APPARATUS AND METHOD FOR COATING POLYIMIDE LAYER

This application claims the benefit of Korean Patent Application No. 10-2006-0055575 filed in the Republic of Korea on Jun. 20, 2006, which is hereby incorporated by reference in its entirety.

BACKGROUND OF THE INVENTION

1. Field of the Invention

Embodiments of the invention relating to coating, and more particularly, to an apparatus and method for coating a polyimide layer.

2. Background of the Invention

A liquid crystal display (LCD) device is an apparatus for displaying a desired image by adjusting quantity of light reaching a color filter substrate. The adjustment of the quantity of light is accomplished by changing intermolecular orientation of liquid crystal molecules interposed between a transparent insulating substrate serving as the color filter substrate and an array substrate. One type of LCD device is a thin film transistor liquid crystal display (TFT LCD) device, which uses thin film transistors (TFTs) as switching elements.

In general, an LCD device includes an LCD panel for displaying an image and a driver for driving the LCD panel by applying driving signals to the LCD panel. The LCD panel includes a color filter substrate and an array substrate bonded to each other with a predetermined gap therebetween. A layer of liquid crystal molecules is in the gap between the color filter substrate and the array substrate. The color filter substrate and the array substrate of the LCD panel are manufactured through a plurality of masking processes. Polyimide layers are formed on respective substrates after finishing the masking processes and before the substrates are bonded to each other. The polyimide layers are used as alignment films to arrange the liquid crystal molecules in a predetermined direction.

The polyimide layers can be coated on the substrates through a variety of methods, such as a spin-coating method, a spray-coating method, and an inkjet-coating method. Of the coating methods, the inkjet-coating method is the quickest and easiest to apply because of the use of an inkjet coating apparatus. A plurality of inkjet heads is used in an inkjet coating apparatus to jet polyimide liquid onto the substrates.

Figure 1:
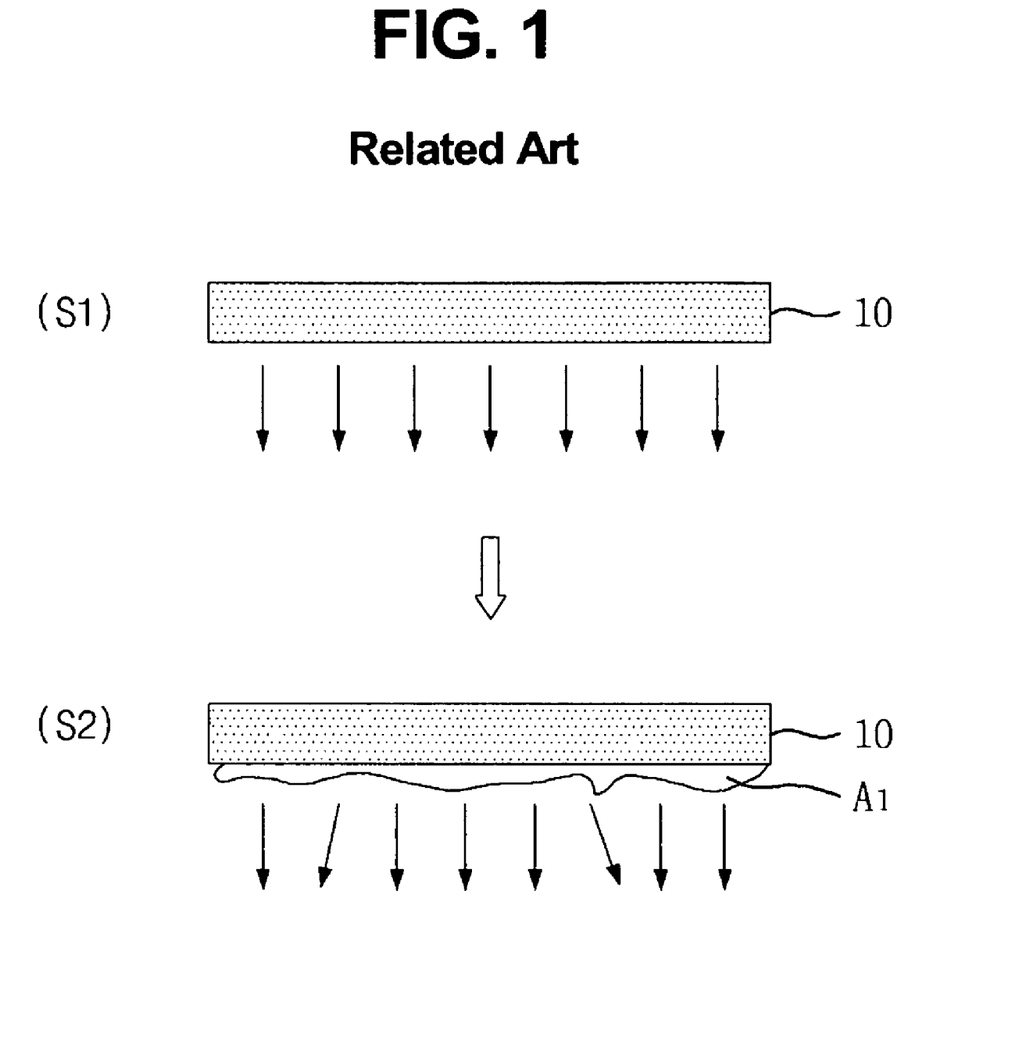
FIG. 1 is a schematic view illustrating an accumulation problem in an apparatus for coating a polyimide layer according to the related art.

FIG. 1 is a schematic view illustrating an accumulation problem in an apparatus for coating a polyimide layer according to the related art. More specifically, FIG. 1 is a view illustrating the jetting surfaces of the inkjet head 10 before (S1) and after (S2) jetting polyimide liquid onto the substrates in the inkjet-coating method according to the related art. The inkjet head 10 moves in a predetermined direction above a print table on which a target substrate is placed while jetting polyimide liquid onto the target substrate, thereby coating a polyimide layer onto the substrate. As shown in status S1 of FIG. 1, when the jetting surface of the inkjet head 10 is clean and does not have any residue thereon, polyimide liquid can be jetted uniformly so that a polyimide layer having uniform thickness can be formed on the substrate. However, as shown in status S2 of FIG. 1, polyimide liquid residue can accumulate on the jetting surface A1 of the inkjet head 10 even after only one inkjet coating process.

The accumulated polyimide liquid residue on the jetting surface of the inkjet head 10 interferes with jetting of the polyimide liquid during a subsequent inkjet coating process. Thus, a non-uniform polyimide layer may be coated on a substrate or, in extreme cases, no polyimide layer is coated on a substrate. The non-uniform polyimide layer can include pinhole faults and/or line blemishes. Even if the jetting surface of the inkjet head is cleaned using a cleaning bar, polyimide residue may still remain on the inkjet head.

SUMMARY OF THE INVENTION

Accordingly, embodiments of the invention is directed to an apparatus and method for coating a polyimide layer that substantially obviates one or more of the problems due to limitations and disadvantages of the related art.

An object of embodiments of the invention is to provide an apparatus and method for coating a polyimide layer that prevents pinhole faults and line blemishes from occurring in the polyimide layer.

Another object of embodiments of the invention is to provide an apparatus and method for coating a polyimide layer that can extend the lifetime of an inkjet head.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an apparatus for coating a polyimide layer includes a printing table in which a substrate is provided, an inkjet head having an injection surface with nozzles for injecting a polyimide liquid onto the substrate, a polyimide liquid supply tank filled with the polyimide liquid, an ultrasonic cleaner in which a cleaning liquid for cleaning the inkjet head is stored for cleaning the inkjet head with vibrations in the cleaning liquid generated by applying an ultrasonic signal, and a wiper for wiping an injection surface of the inkjet head.

In another aspect, a method of coating a polyimide layer includes positioning one of a thin film transistor array substrate and a color filter substrate on a printing table, providing polyimide liquid into a polyimide liquid supply tank, supplying a polyimide liquid to the inkjet head and injecting the polyimide liquid on the substrate, spraying a solvent onto the inkjet head to clean the inkjet head, dipping the inkjet head into a cleaning liquid and vibrating the cleaning liquid with an ultrasonic signal to clean inside of the inkjet head, and wiping an injection surface of the inkjet head by contacting a wiper to the injection surface and moving the wiper.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention. In the drawings.

DETAILED DESCRIPTION OF THE PREFERRED EMBODIMENTS

Figure 2:
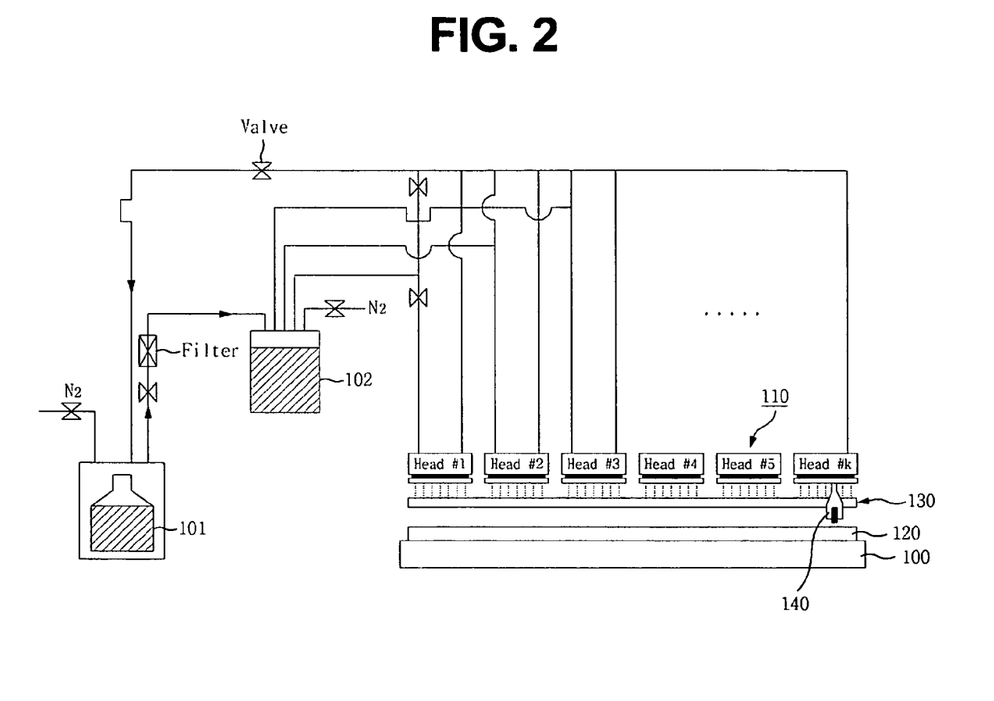
FIG. 2 is a view illustrating a configuration of an apparatus for coating a polyimide layer.

FIG. 2 is a view illustrating a configuration of an apparatus for coating a polyimide layer. Referring to FIG. 2, an apparatus for coating a polyimide layer comprises a printing table 100, an inkjet head 110, a polyimide liquid supply tank 102, an ultrasonic cleaner 130, and a wiper 140. A substrate 120 to which a coating of polyimide layer will be provided is positioned on the printing table 100. The substrate 120 can be a color filter substrate or a thin film transistor array substrate of a liquid crystal display.

A plurality of inkjet heads 110 are arranged in parallel with each other over the substrate 120, and each inkjet head 110 is connected to the polyimide liquid supply tank 102. The polyimide liquid supply tank 102 receives polyimide liquid from a pressure tank 101, and supplies the polyimide liquid to the inkjet head 110 at a predetermined constant pressure and flow rate. Polyimide liquid has the advantage of being heat resistant, chemically stable and high reliability.

A gas connection pipe provides nitrogen ($N_2$) to the pressure tank 101. A polyimide liquid recovery connection pipe provides polyimide liquid recovered from the inkjet head to the pressure tank 101. A polyimide supply connection pipe through which polyimide liquid is provided to the polyimide supply tank 102 through a filter is connected to the pressure tank 101. Further, each connection pipe is provided with a valve for controlling amount of the content passing through the connection pipes and the pressure in the connection pipes.

A jetting surface of each inkjet head 110, which faces the substrate 120, is provided with a plurality of nozzles 111 for jetting the polyimide liquid therethrough. The inkjet head 110 scans over the substrate 120 while jetting the polyimide liquid onto the substrate 120, thereby forming a polyimide layer on the substrate 120. After jetting the polyimide layer onto the substrate, the jetting surface of the inkjet head 110 is wet with the polyimide liquid. The polyimide liquid remaining on the jetting surface of the inkjet head 110 is then removed by a wiping with a wiper 140 and the inkjet head can be further cleaned by an ultrasonic cleaning operation with an ultrasonic cleaner 130. Then, the inkjet head 110 can be wiped again with wiper 140 to remove any residual cleaning liquid after the ultrasonic cleaning operation. In the alternative, the inkjet head can be first ultrasonically cleaned and then wiped without first wiping the inkjet head. In yet another alternative, the inkjet head can be first sprayed with a solvent, ultrasonically cleaned and then wiped without first wiping the inkjet head. Such cleaning methods, maintain the inkjet head and the jetting surface of the inkjet head in a state such that polyimide liquid can be jetted uniformly.

Figure 3:
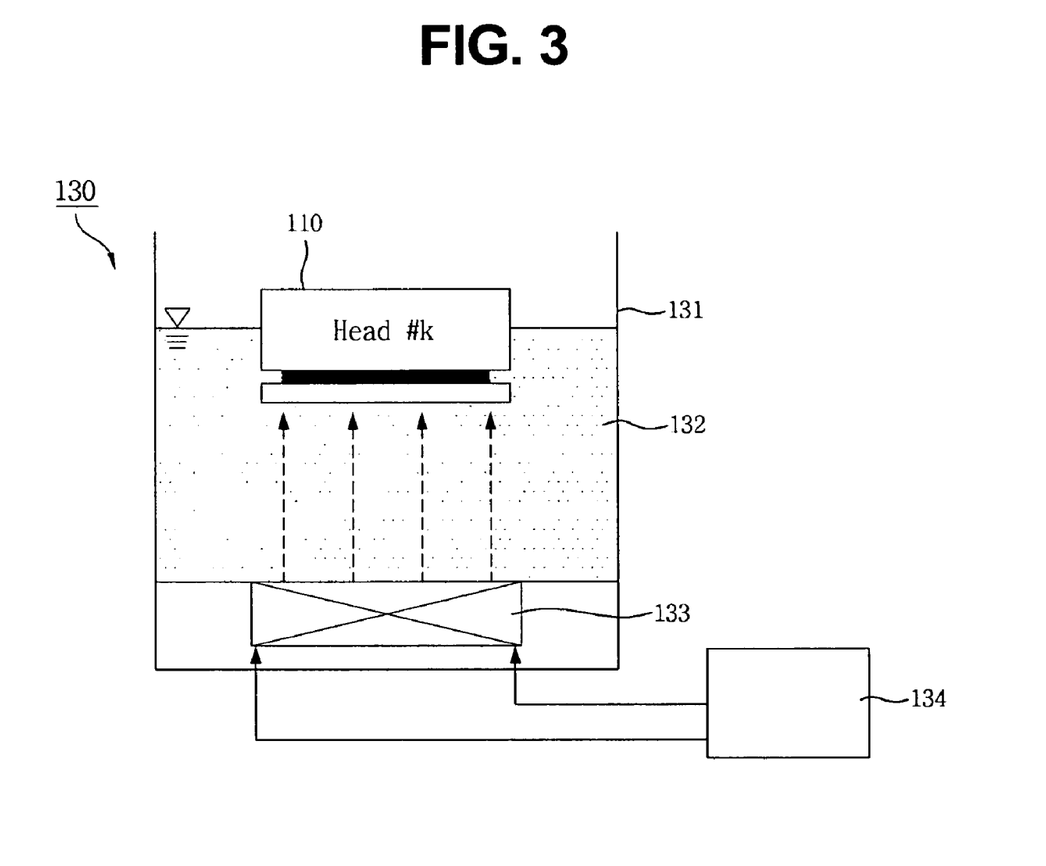
FIG. 3 illustrates the ultrasonic cleaning operation of one of the inkjet heads 110 shown in FIG. 2.

FIG. 3 illustrates the ultrasonic cleaning operation of one of the inkjet heads 110 shown in FIG. 2. The ultrasonic cleaner 130 includes a storage unit 131 that stores cleaning liquid, an ultrasonic oscillator 133 that is mounted within the storage unit 131 for applying an ultrasonic signal to the cleaning liquid 132 to vibrate the cleaning liquid 132, and a controller 134 that controls the ultrasonic oscillator 133, as shown in FIG. 3. The ultrasonic cleaner 130 cleans the inkjet head 110 by vibrating the cleaning liquid in and around the inkjet head 110.

The storage unit 131 of the ultrasonic cleaner 130 stores the cleaning liquid 132 into which the inkjet head is dipped during an ultrasonic cleaning process. The storage unit 131 can be configured to clean each inkjet head 110 individually, as shown in FIG. 3, or a groups of inkjet heads 110. Further, the ultrasonic cleaner 130 can be mounted so as to be movable up to an inkjet head 110 to dip the inkjet in cleaning solution and movable down from the inkjet head 110 away from the ultrasonic cleaner 130.

The ultrasonic oscillator 133 is arranged in a lower part or a side part of the storage unit 131 and receives an electrical ultrasonic signal from the controller 134. The ultrasonic oscillator 133 is in contact with the cleaning liquid 132. The ultrasonic oscillator 133 converts the electrical ultrasonic signal from the controller 134 to a mechanical signal and for vibrating the converted mechanical signal through a medium of the cleaning liquid 132. As shown in FIG. 3, the ultrasonic oscillator 133 is in position opposite to the injection surface of the inkjet head so that the ultrasonic oscillator 133 can clean an inner wall of a nozzle as well as the injection surface of the inkjet head 110. More specifically, cavitation is generated in the cleaning liquid 132 by generation of vibration such that polyimide particles remaining on inner wall and the outer surface of the inkjet head 110 are removed. The controller 134 applies an ultrasonic signal for operating the ultrasonic oscillator 133 with an ultrasonic signal having a frequency in a range of about 20 kHz to about 400 kHz. The cleaning liquid 132 can be isopropyl alcohol.

Figure 4:
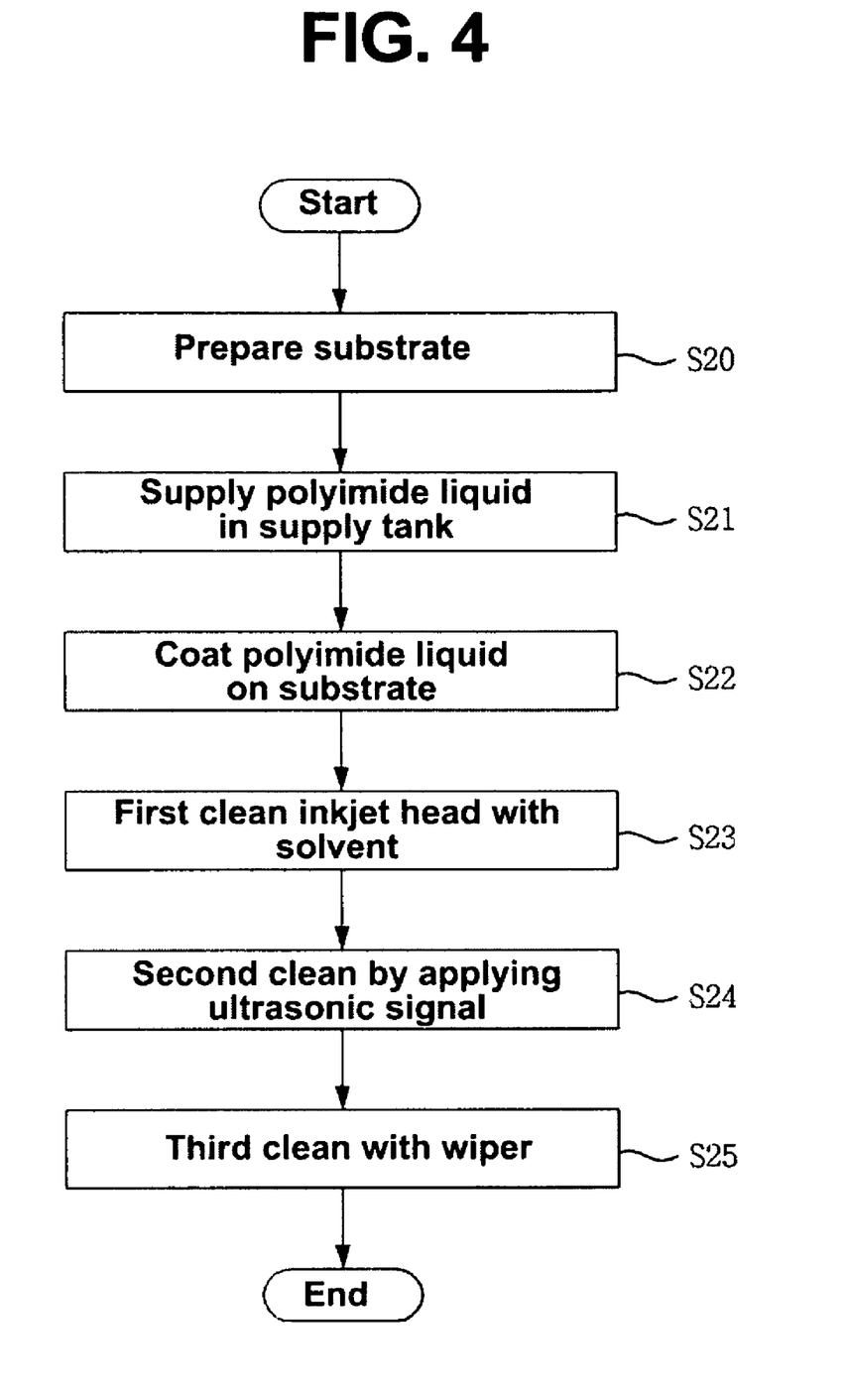
FIG. 4 is a flowchart of an implementation of a method of coating a polyimide layer.
Figure 5:
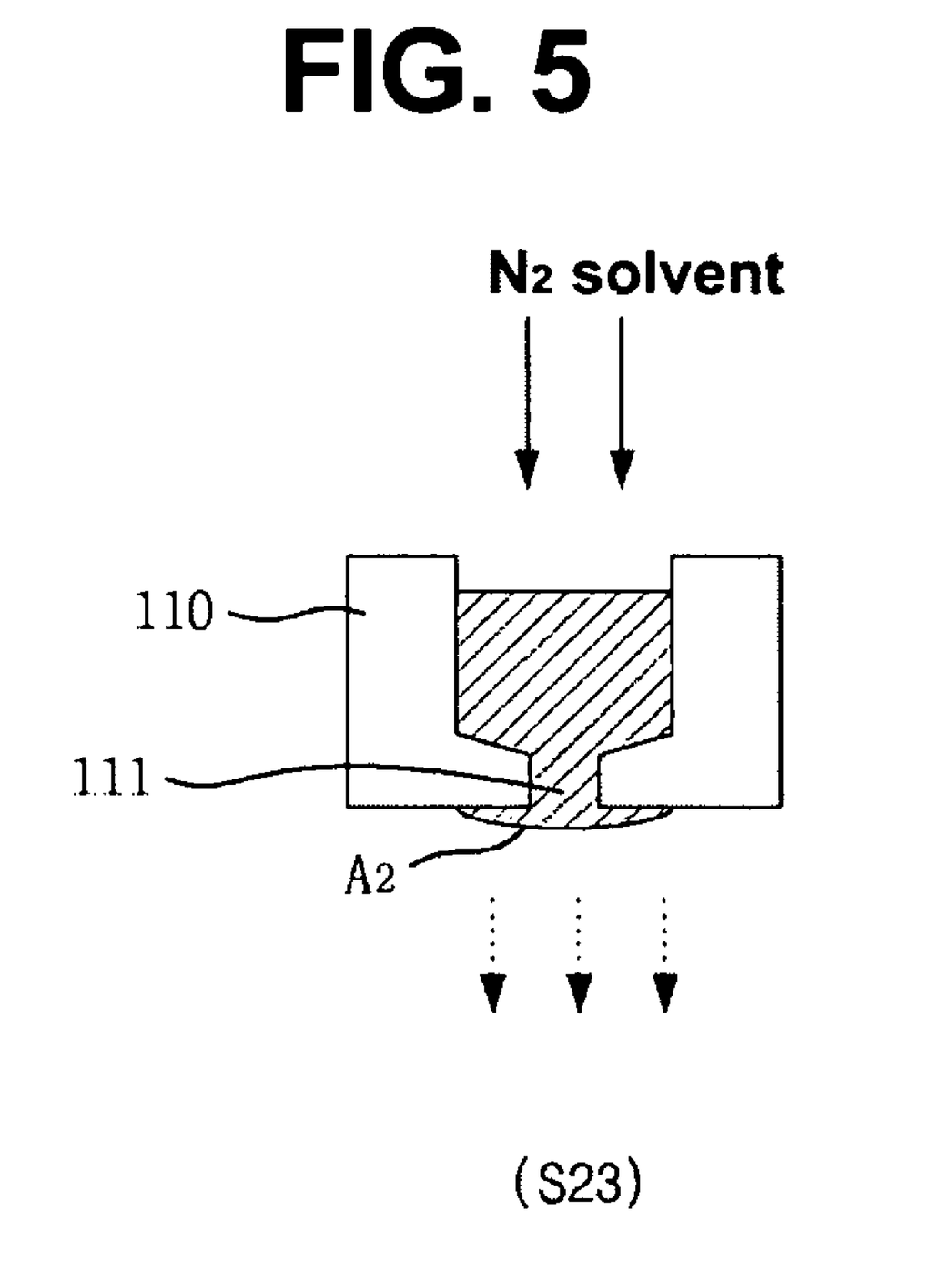
FIGS. 5 to 7 are views explaining each process step of FIG. 4.
Figure 6:
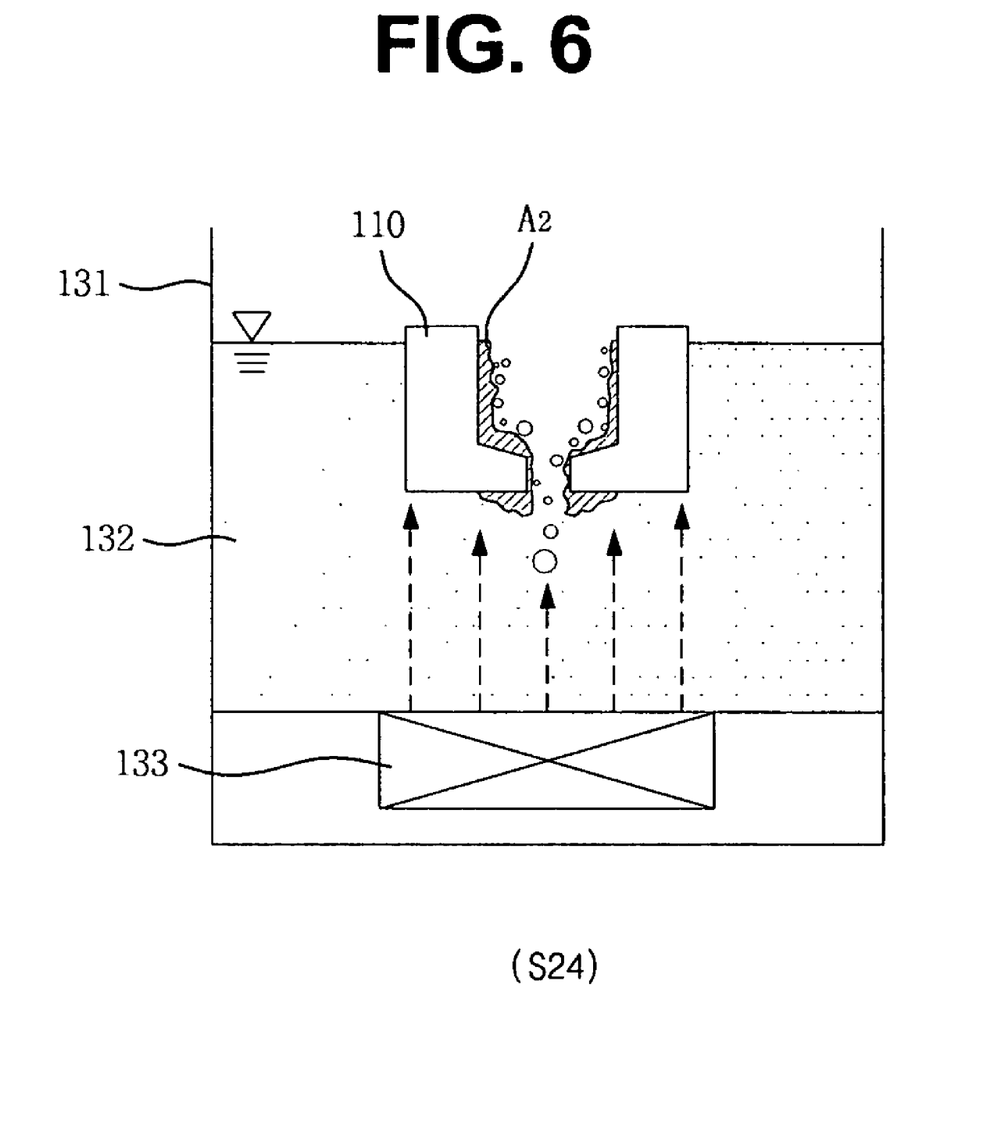
Figure 7:
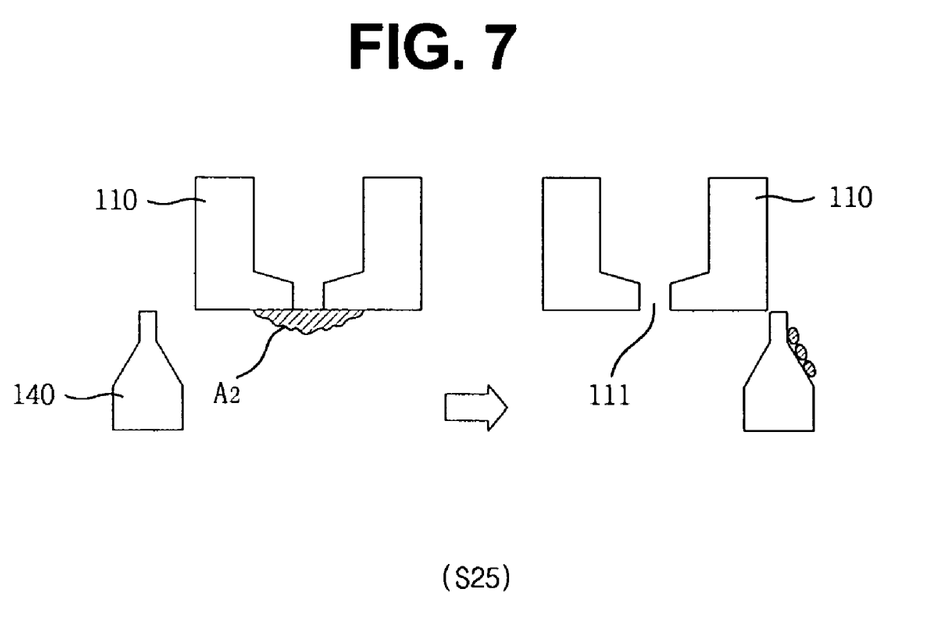

FIG. 4 is a flowchart of an implementation of a method of coating a polyimide layer. FIGS. 5 to 7 are views explaining each process step of FIG. 4.

As shown in, the substrate 120 is arranged on the printing table 100, as described in step S20 of FIG. 4. The substrate 120 can be a thin film transistor array substrate or a color filter substrate for use in a liquid crystal display.

Next, a polyimide liquid vessel filled with polyimide liquid is loaded into the polyimide liquid supply tank 102, as described in step S21 of FIG. 4. Subsequently, the polyimide liquid is supplied to the inkjet head 110 installed over the print table 100, and then jetted on the substrate 120 through the nozzles 111 provided on the jetting surface of the inkjet 110 to coat polyimide liquid onto the substrate 120, as described in step S22 of FIG. 4.

Next, as shown in FIG. 5, a first cleaning operation of removes polyimide particles A2 remaining on the inkjet head 110 by spraying a solvent onto the inkjet head 110 using a high pressure gas, as described in step S23 of FIG. 4. The high pressure gas can be a nitrogen ($N_2$) gas. The solvent can be water, polyimide liquid or N-methyl pyrrolidone imide-based polar solvent to remove both cured and uncured polyimide liquid. After the first cleaning operation, polyimide particles A2 still remain on an inner wall of the nozzle 111 of the ink my head 110.

Next, after dipping the inkjet head 110 into the cleaning liquid 132 by moving the storage unit 131 of the ultrasonic cleaner 130 into position, as shown in FIG. 6, a second cleaning operation to remove fine polyimide particles A2 remaining on an inner wall of the inkjet head 110 is performed by generating vibration in the cleaning liquid 132 through an ultrasonic oscillator 133 that receives an ultrasonic signal to, as described in step S24 of FIG. 4.

If vibration is generated in the cleaning liquid 132 toward the inkjet head 110, bubbles are formed by the change of a sound pressure. The bubbles emit a strong sound wave that collide with the fine polyimide particles A2 as the bubbles move past the inner wall of the inkjet head 110. As a result of this phenomenon, fine polyimide particles A2 remaining on the inner wall of the inkjet head 110 are peeled or agitated off of the inner wall of the inkjet head 110.

As shown in FIG. 7, a third cleaning operation in which the nozzles 111 of the inkjet head 110 are wiped by moving the wiper 140 while the wiper 140 comes in contact with the injection surface of the ink head 110, as described in step S25 of FIG. 4. After the first and second cleaning operations are completed, the third cleaning operation cleans cleaning liquid adhered after the second cleaning operation as well as polyimide particles A2 remaining on the injection surface of the inkjet head 110.

To clean the liquid inkjet head 110 of a polyimide layer coating apparatus for forming a polyimide layer with an inkjet method, a first cleaning uses a solvent, a second cleaning uses vibration generated by an ultrasonic signal, and a third cleaning of uses a wiper 140 so that fine polyimide particles A2 can be removed from the inkjet head 110 can be clearly removed. According to embodiments of the invention, by removing fine particles remaining on an inner wall of a nozzle of an inkjet head prior to a process of coating a polyimide layer by an inkjet method, a line stain due to a pinhole failure or the clogging of the nozzle can be prevented. Furthermore, the lifetime of the inkjet head can be extended.

It will be apparent to those skilled in the art that various modifications and variations can be made in the apparatus and method for coating a polyimide layer of embodiments of the invention without departing from the spirit or scope of the invention. Thus, it is intended that embodiments of the invention cover the modifications and variations of this invention provided they come within the scope of the appended claims and their equivalents.

What is claimed is:

1. An apparatus for coating a polyimide layer comprising:
    a printing table in which a substrate is provided;
    an inkjet head having an injection surface with nozzles for injecting a polyimide liquid onto the substrate;
    a polyimide liquid supply tank filled with the polyimide liquid;
    an inkjet head cleaner spraying a solvent onto the inkjet head using a high pressure gas;
    an ultrasonic cleaner in which a cleaning liquid for cleaning the inkjet head is stored for cleaning the inkjet head with vibrations in the cleaning liquid generated by applying an ultrasonic signal; and
    a wiper for wiping an injection surface of the inkjet head.

2. The apparatus of claim 1, wherein the ultrasonic cleaner includes:
    a storage unit that stores the cleaning liquid;
    a ultrasonic oscillator that is mounted in the storage unit for applying ultrasonic vibrations to the cleaning liquid; and
    a controller that controls an operation of the ultrasonic oscillator with electrical ultrasonic signals.

3. The apparatus of claim 2, wherein the storage unit is mounted so that the inkjet head can be dipped into the cleaning liquid.

4. The apparatus of claim 2, wherein the ultrasonic oscillator is in contact with the cleaning liquid and converts the electrical ultrasonic signal from the controller to a mechanical signal to vibrate the converted mechanical signal through the cleaning liquid.

5. The apparatus of claim 2, wherein the ultrasonic oscillator is in a position opposite to the injection surface of the inkjet head.

6. The apparatus of claim 1, wherein the cleaning liquid includes isopropyl alcohol.

7. The apparatus of claim 1, wherein the ultrasonic signal has a frequency in a range of about 20 kHz to about 400 kHz.

* * * * *